(12) United States Patent
Wells

(10) Patent No.: US 7,498,821 B2
(45) Date of Patent: Mar. 3, 2009

(54) NON-LINEAR OBSERVERS IN ELECTRIC POWER NETWORKS

(75) Inventor: Charles H. Wells, Emerald Hills, CA (US)

(73) Assignee: OSIsoft, Inc., San Leandro, CA (US)

( * ) Notice: Subject to any disclaimer, the term of this patent is extended or adjusted under 35 U.S.C. 154(b) by 230 days.

(21) Appl. No.: 11/544,305

(22) Filed: Oct. 6, 2006

(65) Prior Publication Data

US 2007/0096747 A1    May 3, 2007

Related U.S. Application Data

(60) Provisional application No. 60/731,425, filed on Oct. 27, 2005.

(51) Int. Cl.
*G01R 31/08* (2006.01)
(52) U.S. Cl. .................... 324/521; 324/520
(58) Field of Classification Search ........... 324/520, 324/521
See application file for complete search history.

(56) References Cited

U.S. PATENT DOCUMENTS

| | | | |
|---|---|---|---|
| 5,483,147 A * | 1/1996 | Ilic et al. ................. | 322/25 |
| 6,534,954 B1 * | 3/2003 | Plett ......................... | 320/132 |
| 2005/0125104 A1 * | 6/2005 | Wilson et al. ............ | 700/295 |
| 2005/0141682 A1 * | 6/2005 | Wells ........................ | 379/90.01 |

OTHER PUBLICATIONS

Gupta, C.P. et al., A method to determine closest Hopf bifurcation in power systems considering exciter and load dynamics, Inter Confer on Energy Management Delivery, 1998, Proc. of EMPD, 1998, p. 293-7.*
Canizares, C. A. et al., Linear performance indices to predict oscillatory stability problems in power systems, IEEE Trans on Power Systems, vol. 19, No. 2, May 2004, p. 1104-1114.*
Boylestad, R. L. Introductory Circuit Analysis, 5th Edition, Merrill Pub. Co., 1987, p. 386-387.*
DeTuglie, Enrico, A corrective control for angle and voltage stability enhancement on the transient time-scale, IEEE Trans on Power Systems, V. 15, N. 4, Nov. 2000, p. 1345-1353.*

(Continued)

*Primary Examiner*—Timothy J. Dole
*Assistant Examiner*—Thomas F. Valone
(74) *Attorney, Agent, or Firm*—Lumen Patent Firm

(57) ABSTRACT

In order to make accurate predictions on whether or not a power grid is stable, it is desirable to know the frequency and phase of at least each "control area" in the power grid. Each control area will ideally have power generation matched with its load. Rather than measure thousands of data points at low resolution in order to calculate potential grid instabilities, one may make few highly accurate measurements at low voltage to predict frequency and phase of high voltage transmission lines. Predicted data at the transmission points can then be used to calculate the relative stability of the power grid. The method includes the use of non-linear Luenberger observers and Kalman filters. The method can also be used to compute "Virtual measurements" for any component in the connected grid based on lower cost or easier to obtain measurement at other points on network. This method applies to any connected network of components.

13 Claims, 2 Drawing Sheets

OTHER PUBLICATIONS

Milanovic, J. V. The influence of fault distribution on stochastic prediction of voltage sags, IEEE Trans on Power Deliver, V. 20, No. 1, Jan. 2005, p. 278-285.*

Liu, C-W, Detection of Transiently Chaotic Swings in Power systems Using Real-Time Phasor Measurements, IEEE Trans on Power Systems, vol. 9, N. 3, Aug. 2004, p. 1285-1292.*

Sherwood, M et al., Real-tim detection of angle instability using synchrophasors and action principle, IREP Symposium-Bulk Power System Dynamics and Control, Aug. 19-24, 2007.*

* cited by examiner

NON-LINEAR OBSERVERS IN ELECTRIC POWER NETWORKS

RELATED APPLICATIONS

This application claims priority under 35 U.S.C. § 119(e) to provisional application No. 60/731,425 filed on Oct. 27, 2005 titled "Non-linear Observers in Electric Power Networks."

FIELD

The invention relates to electrical power grids, and, more particularly, to power grid stability estimations based on low voltage grid measurements.

BACKGROUND

Both frequency and phase angle are critical measurements in an electric power grid. Accurate measurements of frequency and phase angle are now accessible primarily due to the availability of an accurate world wide time synchronization signal via the GPS constellation. The timing synchronization signals are accurate to better than one microsecond and are reported in UTC time.

Using these new sensors, one can now measure frequency to better than one part in 10,000 and absolute phase angle to better than one part in 1,000.

The US Electric power grid comprises a number of "control areas or balancing authorities," each responsible for maintaining a balance between its generation and load. If persistent under-frequency occurs, at least one control area is consuming more power from the grid than it is supplying. This lowers frequency and shifts the phase angles. Minor deviations at the control area level are routine. The North American Electric Reliability Council (NERC) has established operating rules that specify maximum permissible deviations, and focus on prohibiting persistent deviations, but not instantaneous ones. Each control area computes a measure of performance called the Area Control Error (ACE). This value should be zero for stable operation of the grid. This measure determines how well each control area matches its load and generation.

It has been common practice to estimate the phase angles using a network model with normal measures of generation and load. This involves a traditional "load flow" solution in combination with measurements. This process is called "State Estimation". The solution to this problem involves solving a large dimensional problem, typically up to 30,000 nodes. A solution is not always guaranteed and it is highly dependent on the real time topology of the grid. This is not always known with certainty.

SUMMARY

By measuring power grid data at one location and comparing the data to a model of the power grid, one can estimate the frequency and/or phase of another location on the power grid. The estimated state of the other location can be used to estimate the relative stability of the power grid.

DESCRIPTION

One solution to the issue discussed in the background section is to use a set of highly accurate measurements of frequency and phase angle at lower voltages, using them to estimate voltages and phase angle at the transmission substations. For example, one such device that meets the requirements is manufactured by Arbiter Systems (Model 1133A Power Sentinel).

Luenberger Observer

Power system models can be written in Differential Algebraic Equations (DAE) form as follows:

$$\dot{x} = f(x,u,y,p) \quad \text{(eq. 1)}$$

$$0 = g(x,u,y,p) \quad \text{(eq. 2)}$$

where x is a vector representing the state of the interconnected power system, u is the input vector, p is the system parameters, and y is the vector of observed variables at each bus.

The non-linear Luenberger observer is given by:

$$\dot{\tilde{x}} = f(\tilde{x}, u, y, p) + K_x v_{de} + K_p (y_m - y) \quad \text{(eq. 3)}$$

$$0 = h(\tilde{x}, u, y, p) + K_y v_{de} \quad \text{(eq. 4)}$$

$$\frac{\partial v_{de}}{\partial t} = K_{de}(y_m - y) \quad \text{(eq. 5)}$$

where:
$K_x$, $K_p$, $K_y$, and $K_{de}$ are gain matrices,
$y_m$ is the vector of output measurements, and
$v_{de}$ is the vector of unknown disturbances.

Kalman Filter

A second method of estimating the phase angle from other phase angle measurements is by applying the extended non-linear Kalman filter. A Kalman filter is an efficient recursive filter which estimates the state of a dynamic system from a series of incomplete and noisy measurements. Kalman filters are well known theory. Therefore, there is no need to describe the Kalman filter in this document.

Figure 1:
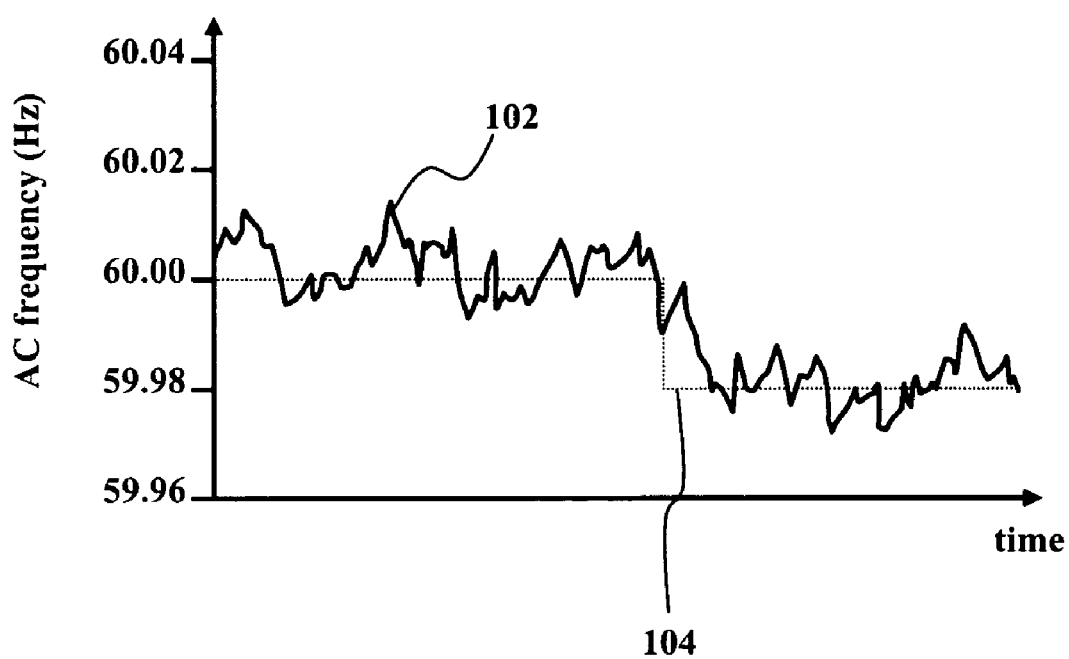
FIG. 1 shows an example of scheduled frequency vs. actual frequency of a power grid.

FIG. 1 shows an example of scheduled frequency vs. actual frequency of a power grid. The scheduled frequency 104 is different that the actual frequency 102.

Figure 2:
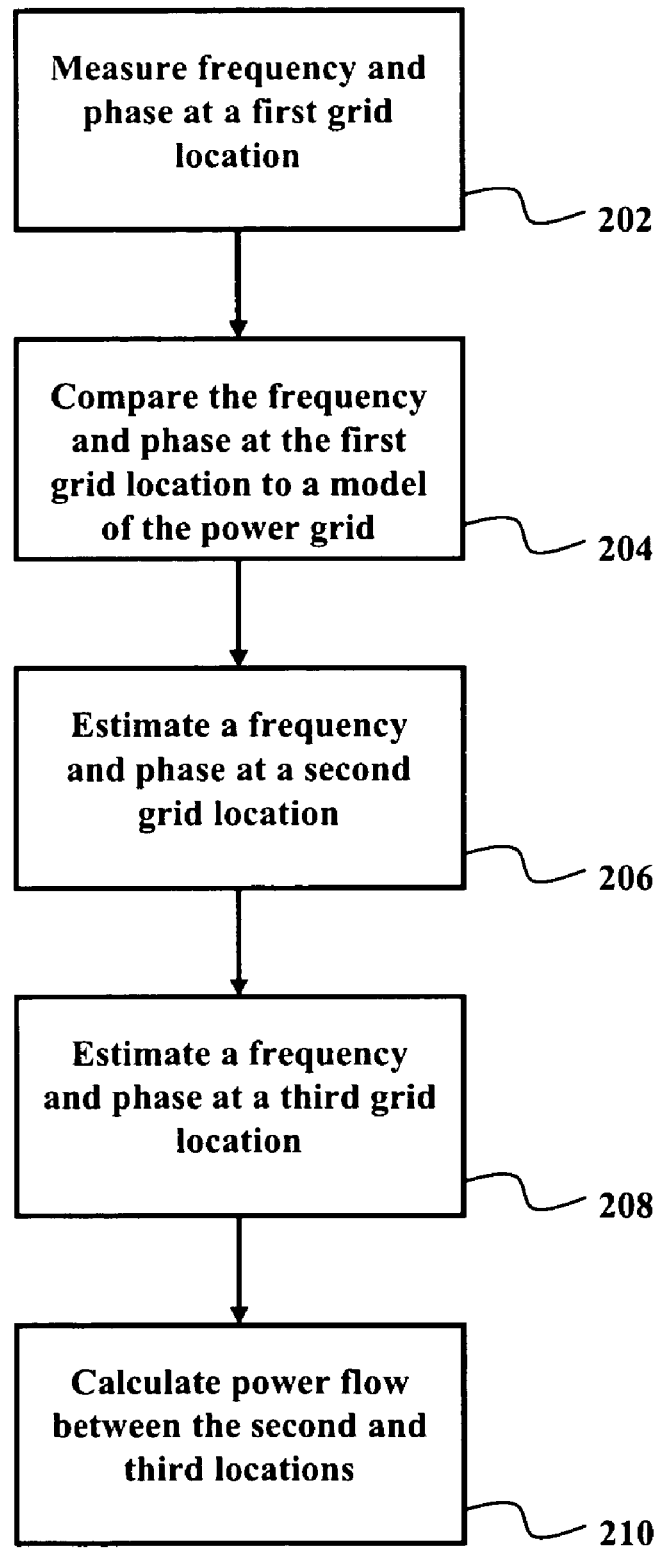
FIG. 2 shows a flow chart of various steps in a grid stability check.

FIG. 2 shows a flow chart of various steps in a grid stability check. In 202, frequency and phase are measured at a first grid location. In 204, the frequency and phase at the first grid location are compared to a model of the power grid. In 206, the frequency and phase at a second grid location is estimated based on the model. In optional step 208, the frequency and phase at a third grid location is estimated based on the model. In optional step 210, power flow between the second and third locations is calculated.

This method will work for computing a dependent variable contained in the model. This includes for example computing voltage, current, real power, reactive power, positive sequence voltages and currents, negative sequences, zero sequences.

This method is useful for estimating properties of higher voltage buses of the transmission grid from measurements at lower voltage. This may be particularly cost effect for the industry since measurements at higher voltages are more costly and dangerous.

One method known to be especially efficient in modeling power systems, as well as efficient in obtaining its solution, is that offered in the Distribution Engineering Workstation (DEW) model developed originally at Virginia Tech by Prof. Broadwater. This solution method is ideally suited for implementing the technology disclosed in this application. Using DEW, the model is stored in computer memory in the form of "linked lists." This form of data storage is familiar to those trained in the art of computer science, but is generally not known to those trained in the power system field. This new data architecture was not supported under earlier programming languages such as FORTRAN, but is supported in modern languages such as "C".

In the DEW approach, the model is stored in an "edge-edge" connected tree (also known as a graph) allowing multiple software agents to traverse the tree structures at very high speeds. This technique is well known to computer scientists; but, generally unknown to power system engineers. The methods to solve the model are faster than those available currently, thus supporting one implementation of the invention.

Each object in the model includes a set of properties and behavior including values of estimated measurements such as voltage, current, and power flow. When an actual measurement of a variable is available from a system sensor, it can be introduced to the object as an input variable.

Comparing the modeled variable with the measured variable as shown in equation (3) represents the use of the Luenberger observer in this patent. Thus, simply introducing eq (3) into the object behavior provides the means to estimate the electrical properties of other connected components in a network. The algorithm will drive the difference between the modeled measurement and the actual measurement to zero, thus affecting the behavior of other components in the network model. This method of introducing actual measurements to a connected model supports a concept we call "Virtual SCADA". The term SCADA (Supervisory Control and Data Acquisition) is well known to those practiced in the field; however, we introduce the notion of combining measurements with models to form "computed" measurements as well as actual measurements. In other industries this term is often referred to as "virtual sensors", however, this application may specifically use the Luenberger observer method combined with a very fast modeling method for networked systems.

This invention is not limited to electric power networks. This approach can be used in any physically connected system such as gas transmission, air conditioning, water, waste water, and other connected systems.

What is claimed is:

1. A method of detecting instability in a power grid, the method comprising:
   measuring a first frequency at a first location on the power grid;
   measuring a first phase angle at the first location on the power grid;
   comparing the first frequency and the first phase angle to a model of the power grid;
   estimating a second frequency and a second phase angle at a second location on the power grid based on the first frequency, the first phase angle, and the power grid model;
   computing moving averages of absolute phase difference between pairs of phase angle estimates;
   comparing the moving averages with predetermined limits; and
   alerting operators to a potential power grid instability based on the moving averages.

2. The method of claim 1, further comprising:
   estimating a third frequency and a third phase angle at a third location on the power grid based on the first frequency, the first phase angle, and the power grid model; and
   calculating power flow between the second and third locations.

3. The method of claim 1, further comprising alerting operators to a potential power grid instability based on the second frequency and the second phase angle.

4. The method of claim 1, further comprising:
   using a non-linear function as part of estimating the second frequency and second phase angle.

5. The method of claim 4, where the non-linear function comprises a non-linear Luenberger observer.

6. The method of claim 4, where the non-linear function comprises an extended Kalman filter.

7. The method of claim 1, where the second location on the power grid comprises a transmission substation.

8. The method of claim 1, where the first frequency measurement has an accuracy of at least one part in 10,000.

9. The method of claim 1, where the first phase angle measurement has an accuracy of at least one part in 1,000.

10. The method of claim 1, further comprising:
    estimating a dependent variable of the power grid model at the second location.

11. The method of claim 1, where the second location is a high voltage part of a transmission grid.

12. A method of detecting instability in a power grid, the method comprising:
    measuring a first frequency at a first location on the power grid;
    measuring a first phase angle at the first location on the power grid;
    comparing the first frequency and the first phase angle to a model of the power grid;
    estimating a second frequency and a second phase angle at a second location on the power grid based on the first frequency, the first phase angle, and the power grid model;
    where the first frequency measurement has an accuracy of at least one part in 10,000.

13. A method of detecting instability in a power grid, the method comprising:
    measuring a first frequency at a first location on the power grid;
    measuring a first phase angle at the first location on the power grid;
    comparing the first frequency and the first phase angle to a model of the power grid;
    estimating a second frequency and a second phase angle at a second location on the power grid based on the first frequency, the first phase angle, and the power grid model;
    where the first phase angle measurement has an accuracy of at least one part in 1,000.

* * * * *